United States Patent
Wakita et al.

(10) Patent No.: US 8,692,619 B2
(45) Date of Patent: Apr. 8, 2014

(54) HIGH FREQUENCY POWER AMPLIFIER

(71) Applicant: Panasonic Corporation, Osaka (JP)

(72) Inventors: Kazuya Wakita, Osaka (JP); Haruhiko Koizumi, Osaka (JP); Shingo Enomoto, Osaka (JP); Hiroaki Kawano, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/937,218

(22) Filed: Jul. 9, 2013

(65) Prior Publication Data

US 2013/0293311 A1    Nov. 7, 2013

Related U.S. Application Data

(63) Continuation of application No. PCT/JP2012/000758, filed on Feb. 6, 2012.

(30) Foreign Application Priority Data

Feb. 14, 2011   (JP) ................................ 2011-029168

(51) Int. Cl.
*H03F 3/04*   (2006.01)

(52) U.S. Cl.
USPC .......................................... 330/296; 330/289

(58) Field of Classification Search
USPC ................... 330/285, 289, 296, 302
See application file for complete search history.

(56) References Cited

U.S. PATENT DOCUMENTS

| | | | |
|---|---|---|---|
| 5,438,298 A | 8/1995 | Hori | |
| 6,731,171 B2* | 5/2004 | Yamashita | 330/285 |
| 7,088,183 B2* | 8/2006 | Kuriyama | 330/296 |
| 7,365,604 B2* | 4/2008 | Luo et al. | 330/296 |
| 7,417,507 B2* | 8/2008 | Yamamoto et al. | 330/296 |
| 7,746,590 B2 | 6/2010 | Fischer | |
| 8,260,224 B2 | 9/2012 | Doherty et al. | |
| 2005/0052224 A1 | 3/2005 | Yang et al. | |
| 2009/0212863 A1 | 8/2009 | Ishimaru | |

FOREIGN PATENT DOCUMENTS

| | | |
|---|---|---|
| JP | 2003-338712 | 11/2003 |
| JP | 2006-093906 | 4/2006 |
| JP | 2007-504769 | 3/2007 |
| JP | 2009-200770 | 9/2009 |

OTHER PUBLICATIONS

International Search Report of PCT Application No. PCT/JP2012/000758 dated Apr. 3, 2012.

* cited by examiner

*Primary Examiner* — Khanh V Nguyen

(74) *Attorney, Agent, or Firm* — Panasonic Patent Center

(57) ABSTRACT

Provided is a compact high frequency power amplifier having a high degree of freedom of design with respect to a gain fluctuation immediately after start-up of an amplifier. The high frequency power amplifier includes a speed-up circuit that transiently increases a reference voltage during rise of a control voltage to increase an amount of bias supplied to an amplification transistor from a bias circuit. The speed-up circuit includes a capacitor and an overshoot control circuit. The overshoot control circuit determines an increasing amount of the reference voltage when the reference voltage is transiently increased according to a charge amount charged in the capacitor, and the overshoot control circuit also determines a time constant in charging and discharging the capacitor.

5 Claims, 5 Drawing Sheets

HIGH FREQUENCY POWER AMPLIFIER

BACKGROUND

1. Technical Field

The present invention relates to a high frequency power amplifier, more specifically to a high frequency power amplifier used in mobile communication devices including a mobile phone.

2. Background Art

Nowadays, mobile communication devices such as a mobile phone not only make a telephone call but also become communication means for transmitting and receiving various pieces of data such as a mail and contents. Therefore, the mobile phone is equipped with a wireless LAN (Local Area Network) or the like.

In the wireless LAN, an OFDM (Orthogonal Frequency Division Multiplexing) is used as a modulation wave in conducting high-speed data communication. Because high modulation accuracy is required in a system in which the OFDM is used, high linearity is demanded in the high frequency power amplifier. In order to meet the demand, the high frequency power amplifier is designed such that the sufficient linearity is obtained in the use output, and such that sufficiently high maximum output is obtained with respect to the use output. On the other hand, in order to increase the maximum output of the high frequency power amplifier, it is necessary to increase the number of transistors, or it is necessary to enlarge a size, which results in a delay of a thermal response of the amplifier. Therefore, immediately after the start-up of the amplifier, a time from when a temperature at the amplifier starts to increase due to heat generation of an amplifying transistor to when the temperature is stabilized is lengthened. During the increase of the temperature, a gain or a phase of the amplifier changes to fatally cause degradation of EVM (Error Vector Magnitude) in the OFDM.

For example, Unexamined Japanese Patent Publication No. 2009-200770 (hereinafter PTL 1) discloses a circuit that corrects an influence of the heat generation of the own high frequency power amplifier. That is, in starting a power of a power amplifier, a bias supplied to an amplifying transistor is transiently increased to temporarily increase the gain of the amplifier. Therefore, the time until the temperature fluctuation due to the heat generation of the amplifying transistor reaches the equilibrium state in the entire circuit is shortened in the circuit.

FIG. 6 illustrates a circuit diagram disclosed in PTL 1. A power amplifier in FIG. 6 includes amplification transistor 503, bias circuit 511, power-supply circuit 512, and speed-up circuit 522. Speed-up circuit 522 includes capacitor 521, transistor 519, and transistor 520. In the power amplifier, a charge flows into capacitor 521 during rise of a control voltage that controls on/off of power amplification. Therefore, the current is temporarily passed through collectors of transistor 519 and transistor 520, and a potential at the collector of transistor 519 is temporarily decreased. An output voltage of power-supply circuit 512 is temporarily increased to temporarily increase the bias to amplification transistor 503 from bias circuit 511. Therefore, because the gain of the amplifier is temporarily increased, the time until the temperature fluctuation due to the heat generation of the amplifying transistor reaches the equilibrium state in the entire circuit is shortened.

SUMMARY

On the other hand, in the configuration illustrated in FIG. 6, once the capacitor 521 is charged, the charge is not quickly discharged even if the control voltage falls. For this reason, the charge remains in the capacitor 521 in a burst operation to repeat the on/off in a short time in the wireless LAN. When the control voltage rises again while the charge remains in capacitor 521, it is necessary to sufficiently obtain the charging current of capacitor 521 in order to increase the desired bias. Therefore, it is necessary to increase a capacitance value of capacitor 521, or it is necessary to increase a voltage value during the rise of the control voltage. This becomes a large issue when the high frequency power amplifier is applied to the mobile communication devices, such as the mobile phone, in which downsizing of a component and a low operating voltage of the system advance.

In the configuration illustrated in FIG. 6, it is necessary to adjust the capacitance value of capacitor 521 in order to adjust the increasing amount of the bias during the rise of the control voltage. However, not only the increasing amount of the bias but also the time constant until the completion of the charge of capacitor 521 are changed when the capacitance value of capacitor 521 is adjusted. There is a low design freedom for adjusting the increasing amount of the bias and the time constant until the completion of the charge of capacitor 521. This leads to the low design freedom in adjusting the gain fluctuation immediately after the start-up of the amplifier.

Therefore, there is demand for a compact high frequency power amplifier that can suppress the modulation accuracy degradation caused by the temperature fluctuation immediately after the start-up of the amplifier in the configuration having the high design freedom for the gain fluctuation immediately after the start-up of the amplifier.

In order to solve the problem, one aspect of the present invention provides a high frequency power amplifier including a first transistor that performs power amplification of a high frequency signal and a bias circuit that supplies a bias to the first transistor according to a reference voltage. The high frequency power amplifier also includes a power-supply circuit that applies the reference voltage to the bias circuit, the reference voltage controlling an amount of bias supplied to the first transistor from the bias circuit. The high frequency power amplifier also includes a control voltage terminal to which a control signal is applied, the control signal controlling start-up and stopping of the bias circuit, and a speed-up circuit that increases the amount of bias supplied to the first transistor from the bias circuit by transiently increasing the reference voltage output from the power-supply circuit during rise of the control voltage. The speed-up circuit includes a capacitor in which one end is connected to the control voltage terminal, a time-constant control circuit that is connected to the other end of the capacitor, a discharge circuit that is connected in parallel with the capacitor, and an overshoot control circuit that is connected to the time-constant control circuit and the power-supply circuit. The overshoot control circuit determines an increasing amount of the reference voltage output from the power-supply circuit when the reference voltage is transiently increased according to a charge amount charged in the capacitor. The time-constant control circuit determines a time constant in charging and discharging the capacitor through the time-constant control circuit and the overshoot control circuit.

According to the above configuration, the capacitor is charged during the rise of the control voltage, and the charging current of the capacitor is passed through the overshoot control circuit. Therefore, the reference voltage output from the power-supply circuit can transiently be increased to transiently increase the bias supplied to the first transistor. Accordingly, the gain of the amplifier is temporarily increased to shorten the time until the temperature fluctuation due to the heat generation of the amplifying transistor reaches the equilibrium state in the entire circuit. The EVM degradation caused by the temperature fluctuation due to the heat generation of the amplifying transistor immediately after the start-up of the amplifier can be suppressed.

In the above configuration, during the rise of the control voltage, the transiently increasing amount of the bias can easily be adjusted by the adjustment of the overshoot control circuit. The time constant of the capacitor is adjusted by the time-constant control circuit, so that the transiently increasing amount of the bias during the rise of the control voltage and the time constant until the completion of the charge of the capacitor can separately be adjusted. This leads to the enhancement of the design freedom in adjusting the gain fluctuation immediately after the start-up of the amplifier.

During falling of the control voltage, the charge remaining in the capacitor is discharged by the discharge circuit, so that the charging current of the capacitor can sufficiently be obtained during the next rise of the control voltage even if the capacitor has the small capacitance value. This leads to downsizing of the high frequency power amplifier.

The bias circuit includes a second transistor that supplies the bias to the first transistor, and the overshoot control circuit includes a first resistor in which one end is grounded. The time-constant control circuit includes a third transistor in which an emitter is grounded through the first resistor and a second resistor in which one end is connected to a base of the third transistor. The time-constant control circuit also includes a fourth transistor in which an emitter is connected to the base of the third transistor through the second resistor while a collector is connected to a collector of the third transistor and a collector of the second transistor. One end of the capacitor is connected to a base of the fourth transistor, and the other end is connected to the control voltage terminal. The discharge circuit includes an FET, a gate of the FET is grounded, a source of the FET is connected to the base of the fourth transistor, and a drain of the FET is connected to the control voltage terminal. The power-supply circuit includes a third resistor, one end of the third resistor is connected to the control voltage terminal, and the other end is connected to the base of the second transistor. An emitter of the second transistor of the bias circuit is connected to a base of the first transistor, and a base of the second transistor is grounded through the first resistor.

The bias circuit includes a first FET that supplies the bias to the first transistor, and the overshoot control circuit includes a first resistor in which one end is grounded. The time-constant control circuit includes a third transistor in which an emitter is grounded through the first resistor and a second resistor in which one end is connected to a base of the third transistor. The time-constant control circuit also includes a fourth transistor in which an emitter is connected to the base of the third transistor through the second resistor while a collector is connected to a collector of the third transistor and a drain of the first FET. One end of the capacitor is connected to a base of the fourth transistor, and the other end is connected to the control voltage terminal. The discharge circuit includes a second FET, a gate of the second FET is grounded, a source of the second FET is connected to the base of the fourth transistor, and a drain of the second FET is connected to the control voltage terminal. The power-supply circuit includes a third resistor, one end of the third resistor is connected to the control voltage terminal, and the other end is connected to the first FET. A source of the first FET of the bias circuit is connected to a base of the first transistor. A gate of the first FET is grounded through the first resistor.

According to the above configuration, the overshoot control circuit is constructed by the resistor, and the reference voltage can easily be set to the increasing amount by optimizing the resistance value of the resistor. Therefore, the design freedom is increased.

The power-supply circuit includes a fifth transistor in which a collector is connected to the base of the second transistor while an emitter is grounded through the first resistor and a fourth resistor in which one end is connected to a base of the fifth transistor while the other end is grounded. The power-supply circuit also includes a sixth transistor, a collector is connected to a collector of the second transistor, a base is connected to the base of the second transistor, and an emitter is grounded through the fourth resistor.

The power-supply circuit further includes a fifth transistor in which a collector is connected to the base of the second transistor while a base is connected to the collector. The power-supply circuit also includes a sixth transistor, in which a collector is connected to an emitter of the fifth transistor, a base is connected to the collector, and an emitter is connected to the other end of the first resistor. The third resistor, the fifth transistor, and the sixth transistor constitute a temperature compensation circuit that performs temperature compensation of the reference voltage.

According to the above configuration, the third resistor, the fifth transistor, and the sixth transistor are the temperature compensation circuit that stabilizes the bias against the temperature change.

According to the present invention, the time until the temperature fluctuation due to the heat generation of the amplifying transistor reaches the equilibrium state in the entire circuit can be shortened to suppress the EVM degradation caused by the temperature fluctuation due to the heat generation of the amplifying transistor immediately after the start-up of the amplifier.

In the above configuration, during the rise of the control voltage, the transiently increasing amount of the bias can easily be adjusted by the adjustment of the overshoot control circuit. The time constant of the capacitor is adjusted by the time-constant control circuit, so that the transiently increasing amount of the bias during the rise of the control voltage and the time constant until the completion of the charge of the capacitor can separately be adjusted. This leads to the enhancement of the design freedom in adjusting the gain fluctuation immediately after the start-up of the amplifier.

During falling of the control voltage, the charge remaining in the capacitor is discharged by the discharge circuit, so that the charging current of the capacitor can sufficiently be obtained during the next rise of the control voltage even if the capacitor has the small capacitance value. This leads to downsizing of the high frequency power amplifier.

DESCRIPTION OF EMBODIMENTS

Hereinafter, embodiments of the present invention will be described with reference to the drawings.

First Exemplary Embodiment

Figure 1:
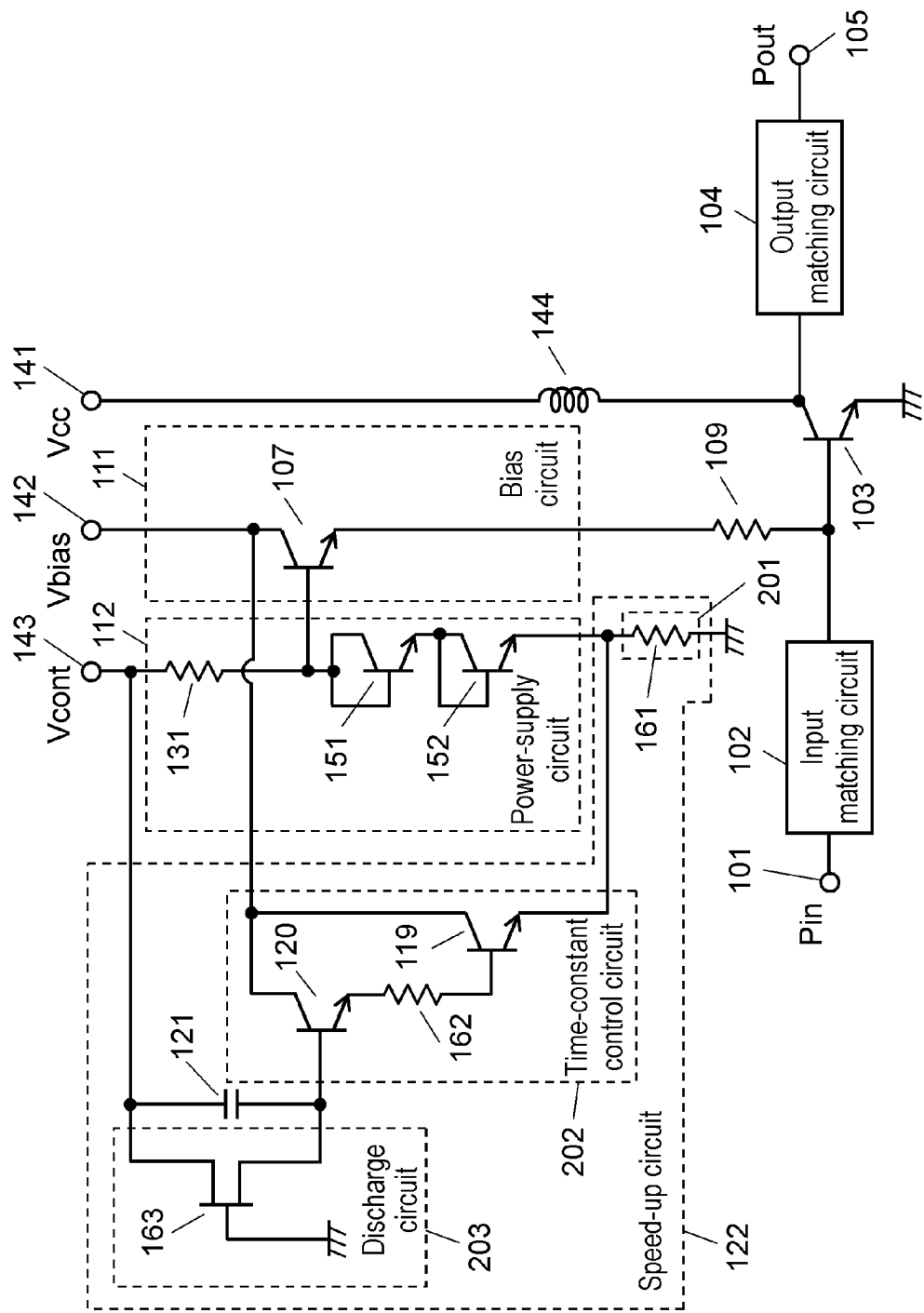
FIG. 1 is a circuit diagram of a high frequency power amplifier according to a first embodiment of the present invention.

FIG. 1 is a circuit diagram of a high frequency power amplifier according to a first embodiment of the present invention. In the high frequency power amplifier of the first embodiment, mainly, provision of overshoot control circuit 201 facilitates determination or setting of an increasing amount when reference voltage Vref used to output a bias is transiently increased immediately after a rise of a control voltage of control voltage terminal 143.

The high frequency power amplifier in FIG. 1 includes input terminal 101, output terminal 105, input matching circuit 102, output matching circuit 104, amplification transistor 103, stabilizing resistor 109, bias circuit 111, power-supply circuit 112, speed-up circuit 122, collector power supply terminal 141, bias power supply terminal 142, control voltage terminal 143, and choke coil 144.

Amplification transistor 103 that is the first transistor performs power amplification of a high frequency signal.

Bias circuit 111 supplies the bias to amplification transistor 103 according to reference voltage Vref applied from power-supply circuit 112. In a specific configuration example, bias circuit 111 includes bias transistor 107 that is the second transistor supplying the bias to amplification transistor 103. Bias transistor 107 supplies the bias to amplification transistor 103 according to reference voltage Vref. An emitter of bias transistor 107 of bias circuit 111 is connected to a base of amplification transistor 103, and a base of bias transistor 107 is grounded through overshoot control circuit 201 (resistor 161).

Power-supply circuit 112 applies reference voltage Vref, which controls an amount of bias supplied to amplification transistor 103 from bias circuit 111, to bias circuit 111. Power-supply circuit 112 includes resistor 131 that is the third resistor. One end of resistor 131 is connected to control voltage terminal 143, and the other end is connected to the base of bias transistor 107 that is the second transistor. Power-supply circuit 112 also includes diode-connected (that is, a collector and a base are short-circuited) transistor 151 and diode-connected transistor 152. Transistor 151 and transistor 152 are connected in series so as to be inserted between resistor 131 and overshoot control circuit 201. A control signal is applied to control voltage terminal 143 in order to control start-up and stopping of bias circuit 111.

Speed-up circuit 122 transiently increases reference voltage Vref output from power-supply circuit 112 during the rise of the control voltage, thereby increasing the amount of bias supplied to amplification transistor 103 from bias circuit 111. Speed-up circuit 122 includes capacitor 121, time-constant control circuit 202, discharge circuit 203, and overshoot control circuit 201. One end of capacitor 121 is connected to control voltage terminal 143, and the other end is connected to time-constant control circuit 202. Discharge circuit 203 is connected in parallel with capacitor 121.

Overshoot control circuit 201 determines the increasing amount of the reference voltage output from power-supply circuit 112, when the reference voltage is transiently increased according to a charge amount charged in capacitor 121. For example, overshoot control circuit 201 may have such a simple circuit configuration that includes resistor 161 that is the first resistor. One end of resistor 161 is grounded, and the other end is connected to power-supply circuit 112.

Time-constant control circuit 202 includes transistor 119 that is the third transistor, resistor 162 that is the second resistor, and transistor 120 that is the fourth transistor. The emitter of transistor 119 is grounded through the first resistor. One end of resistor 162 is connected to the base of transistor 119. The emitter of transistor 120 is connected to the base of transistor 119 through resistor 162, and the collector of transistor 120 is connected to the collector of transistor 119 and the collector of bias transistor 107. Time-constant control circuit 202 determines a time constant in charging and discharging capacitor 121 through time-constant control circuit 202 and overshoot control circuit 201.

One end of capacitor 121 is connected to the base of transistor 120, and the other end is connected to control voltage terminal 143.

Discharge circuit 203 includes FET 163. A gate of FET 163 is grounded, a source is connected to the base of transistor 120, and a drain is connected to control voltage terminal 143.

Input terminal 101 is connected to the base of amplification transistor 103 through input matching circuit 102. The emitter of amplification transistor 103 is grounded. The collector of amplification transistor 103 is connected to collector power supply terminal 141 through choke coil 144, and connected to output terminal 105 through output matching circuit 104. Bias circuit 111 includes bias transistor 107 that supplies the bias to amplification transistor 103. The collector of bias transistor 107 is connected to bias power supply terminal 142, and the emitter of bias transistor 107 is connected to the base of amplification transistor 103 through stabilizing resistor 109. Power-supply circuit 112 includes resistor 131, transistor 151 that is the fifth transistor, and transistor 152 that is the sixth transistor. One end of resistor 131 is connected to control voltage terminal 143, and the other end is connected to the base of bias transistor 107 and the collector and base of transistor 151. The emitter of transistor 151 is connected to the collector and base of transistor 152. In the power-supply circuit, resistor 131, transistor 151, and transistor 152 work as temperature compensation to stabilize the bias against a temperature change. Speed-up circuit 122 includes overshoot control circuit 201, time-constant control circuit 202, discharge circuit 203, and capacitor 121. Overshoot control circuit 201 includes resistor 161, time-constant control circuit 202 includes transistor 119, resistor 162, and transistor 120, and discharge circuit 203 includes FET 163. One end of resistor 161 is grounded, and the other end is connected to the emitter of transistor 152 and the emitter of transistor 119. The base of transistor 119 is connected to the emitter of transistor 120 through resistor 162. The collector of transistor 120 is connected to the collector of transistor 119 and the collector of bias transistor 107. One end of capacitor 121 is connected to control voltage terminal 143, and the other end is connected to the base of transistor 120. The gate of FET 163 is grounded, the drain is connected to control voltage terminal 143, and the source is connected to the base of transistor 120.

In the high frequency power amplifier illustrated in FIG. 1, the high frequency signal is input from input terminal 101 to amplification transistor 103 through input matching circuit 102, and amplification transistor 103 performs the power amplification of the high frequency signal. The amplified high frequency signal is output to output terminal 105 through output matching circuit 104.

On the other hand, during the rise of the control voltage applied to control voltage terminal 143, a charging current is passed until the charge of capacitor 121 is completed. Currents are also passed from the collectors to the emitters of transistor 119 and transistor 120, and the current flows into resistor 161. A base potential at bias transistor 107 is transiently raised to transiently increase the bias supplied to amplification transistor 103, and a gain of the amplifier is temporarily increased. Therefore, the time until the temperature fluctuation due to the heat generation of the amplifying transistor reaches the equilibrium state in the entire circuit is shortened to suppress the EVM degradation caused by the temperature fluctuation due to the heat generation of the amplifying transistor immediately after the start-up of the amplifier. At this point, a resistance value of resistor 161 is designed to have a sufficiently small with respect to a resistance value of resistor 162 to an extent that the time constant is not influenced until the charge of capacitor 121 is completed.

In the high frequency power amplifier illustrated in FIG. 1, a raised amount of the base potential at bias transistor 107 can be adjusted by the resistance value of resistor 161 immediately after the rise of the control voltage. Therefore, the increasing amount of the bias can be adjusted independently of the time constant until the charge of capacitor 121 is completed. Therefore, a design freedom is increased in adjusting the transient change in gain of the amplifier immediately after the rise of the control voltage. Because the charge charged in capacitor 121 is discharged by FET 163 during falling of the control voltage, the charging current of capacitor 121 can sufficiently be obtained in the next falling of the control voltage even if capacitor 121 has a small capacitance value.

Figure 2:
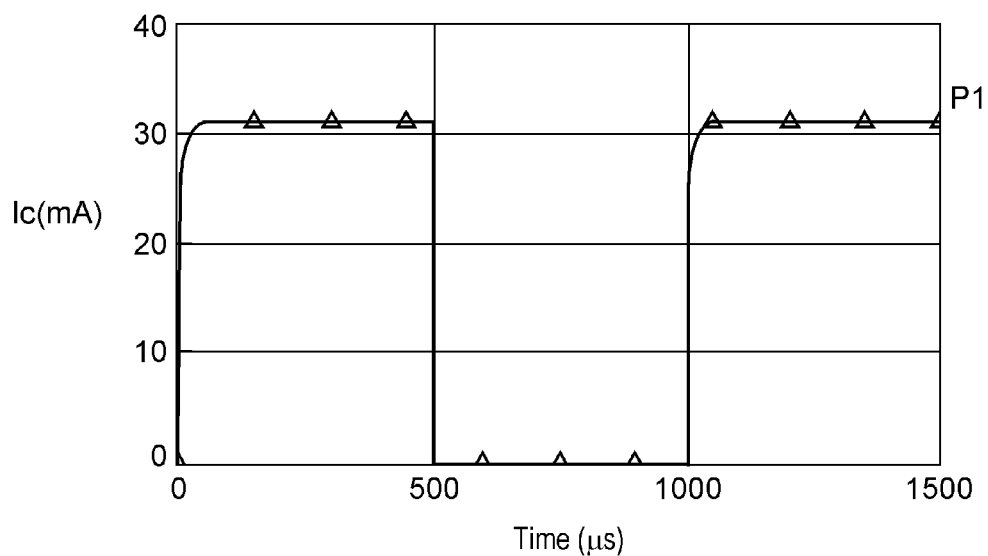
FIG. 2 is a characteristic diagram illustrating an example of a transient response characteristic in a comparative example of the first embodiment of the present invention.

FIG. 2 illustrates an example of a simulation result of a transient response characteristic of an idle current (collector current Ic) of amplification transistor 103 while the high frequency signal is not input, in a comparative example having a configuration in which speed-up circuit 122 of the high frequency power amplifier in FIG. 1 is removed. In the configuration in which speed-up circuit 122 is removed, the idle current changes immediately after the rise (0 μs to 50 μs in FIG. 2) due to a delay of a thermal response of amplification transistor 103. This causes the change in gain or phase immediately after the rise of the amplifier, and also causes the strain and the EVM degradation.

Figure 3:
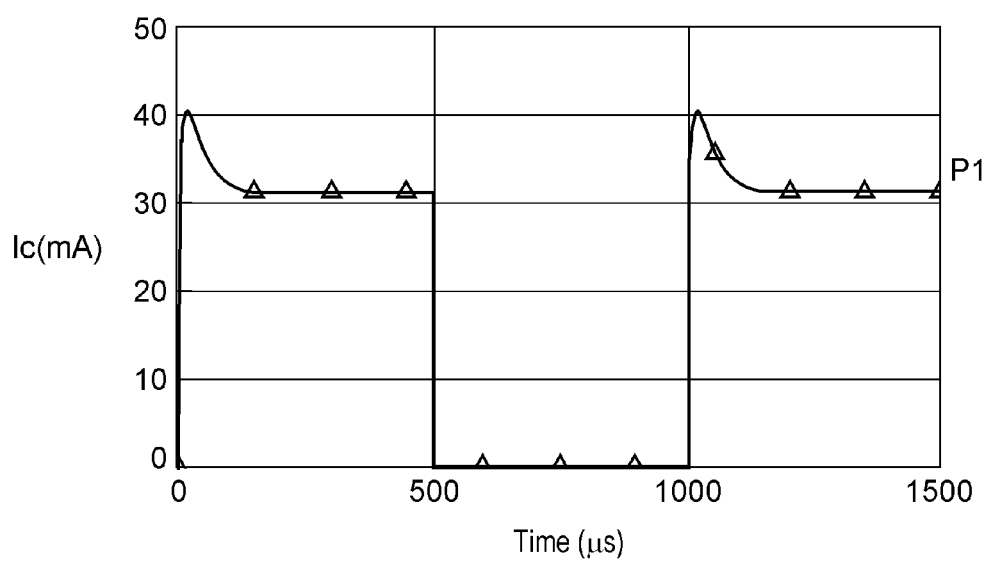
FIG. 3 is a characteristic diagram illustrating an example of a transient response characteristic in the first embodiment of the present invention.

FIG. 3 illustrates an example of the simulation result of the transient response characteristic of the idle current (collector current Ic) of amplification transistor while the high frequency signal is not input in the high frequency power amplifier in FIG. 1. In the first embodiment, the current supplied to amplification transistor 103 from bias transistor 107 is forcedly increased during the rise of the bias. At this point, the capacitance value of capacitor 121 and the resistance values of resistor 161 and resistor 162 are designed to cancel the transient change in gain caused by the temperature change immediately after the rise of the amplifier. Because FET 163 discharges the charge of capacitor 121 during the falling of the bias, the rise of collector current Ic at 1000 us in FIG. 3 is equal to the rise of collector current Ic at 0 us in the increasing amount of the bias. Therefore, the EVM degradation caused by the fluctuation in gain during the rise of the amplifier can be suppressed in the burst operation in which the on/off is repeated in a short time.

Second Exemplary Embodiment

Figure 4:
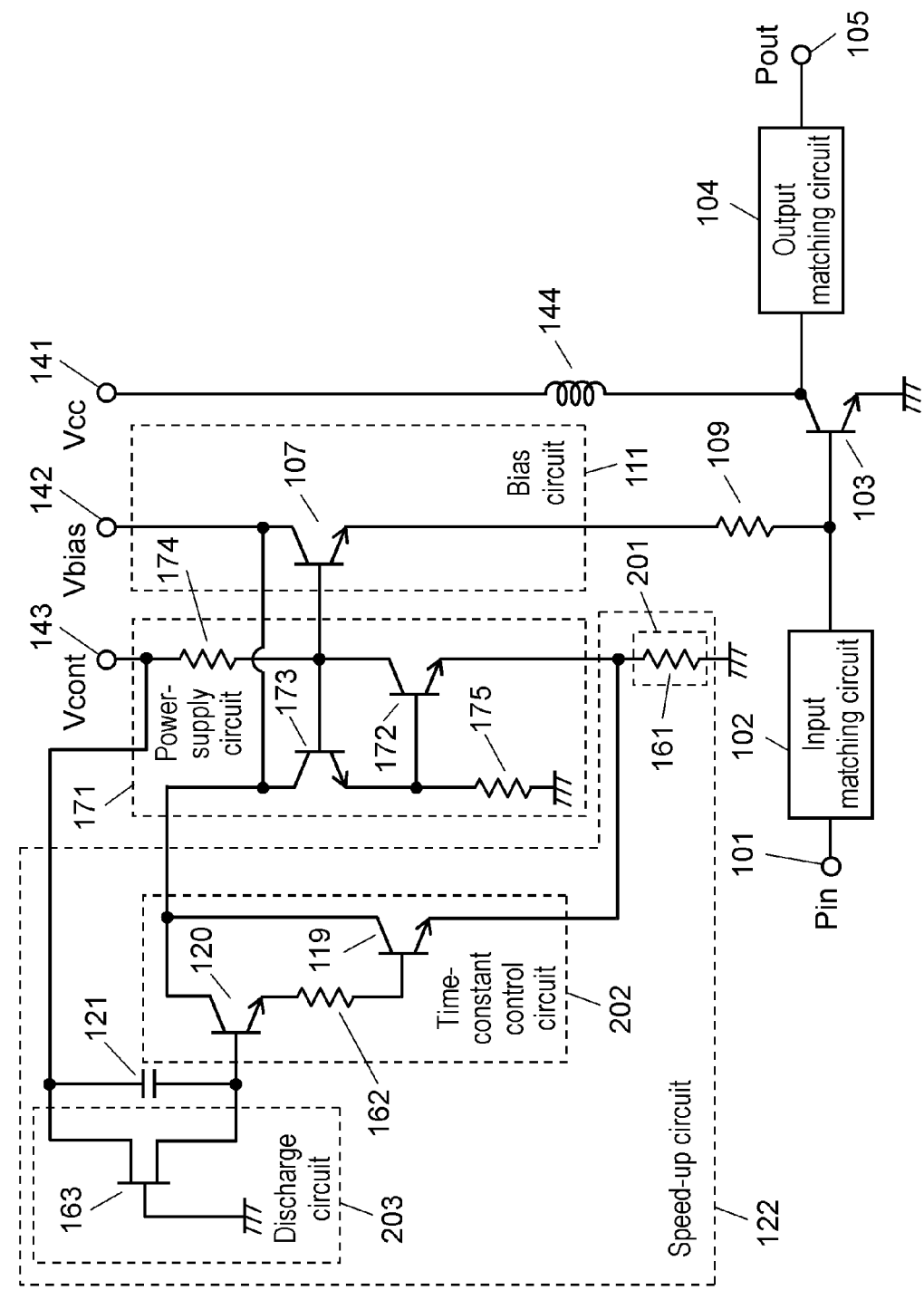
FIG. 4 is a circuit diagram of a high frequency power amplifier according to a second embodiment of the present invention.

FIG. 4 illustrates a circuit diagram of a high frequency power amplifier according to a second embodiment. The high frequency power amplifier of the second embodiment has the same configuration as the high frequency power amplifier of the first embodiment except the power-supply circuit, the same component is designated by the same numeral, and a different point is mainly described while the overlapping description is omitted.

Power-supply circuit 171 includes transistor 172 that is the fifth transistor, resistor 175 that is the fourth resistor, and transistor 173 that is the sixth transistor.

The collector of transistor 172 is connected to the base of bias transistor 107, and the emitter is grounded through resistor 161.

One end of resistor 175 is connected to the base of transistor 172, and the other end is grounded.

The collector of transistor 173 is connected to the collector of bias transistor 107, the base is connected to the base of bias transistor 107, and the emitter is grounded through resistor 175.

Thus, power-supply circuit 171 of the high frequency power amplifier in FIG. 4 includes transistor 172, transistor 173, resistor 174, and resistor 175. One end of resistor 174 is connected to control voltage terminal 143, and the other end is connected to the base of bias transistor 107, the base of transistor 173, and the collector of transistor 172. The collector of transistor 173 is connected to the collector of bias transistor 107, the collector of transistor 119, and the collector of transistor 120. The emitter of transistor 173 is connected to the base of transistor 172, and grounded through resistor 175 in which one end is grounded. The emitter of transistor 172 is grounded through resistor 161. Power-supply circuit 171 plays as the temperature compensation to stabilize the bias against the temperature change.

Also in the high frequency power amplifier illustrated in FIG. 4, during the rise of the control voltage applied to the control voltage terminal, the charging current is passed until the charge of the capacitor 121 is completed, the currents are also passed from the collectors to the emitters of transistor 119 and transistor 120, and the current flows into resistor 161. Therefore, the emitter potential at transistor 172 is raised to decrease the current flowing into the collector of transistor 172, which raising the base potential at bias transistor 107. The bias supplied to the amplification transistor 103 is transiently increased to temporarily increase the gain of the amplifier, thereby shortening the time until the temperature fluctuation due to the heat generation of the amplifying transistor reaches the equilibrium state in the entire circuit. Therefore, the EVM degradation caused by the temperature fluctuation due to the heat generation of the amplifying transistor immediately after the start-up of the amplifier can be suppressed.

In the high frequency power amplifier illustrated in FIG. 4, like the high frequency power amplifier illustrated in FIG. 1, the raised amount of the base potential at bias transistor 107 can be adjusted by the resistance value of resistor 161 immediately after the rise of the control voltage. Therefore, the increasing amount of the bias can be adjusted independently of the time constant until the charge of capacitor 121 is completed.

In the high frequency power amplifier illustrated in FIG. 4, like the high frequency power amplifier illustrated in FIG. 1, the charge charged in capacitor 121 is discharged by FET 163 during the falling of the control voltage. Therefore, the charging current of capacitor 121 can sufficiently be obtained in the next rise of the control voltage even if capacitor 121 has the small capacitance value.

Third Exemplary Embodiment

Figure 5:
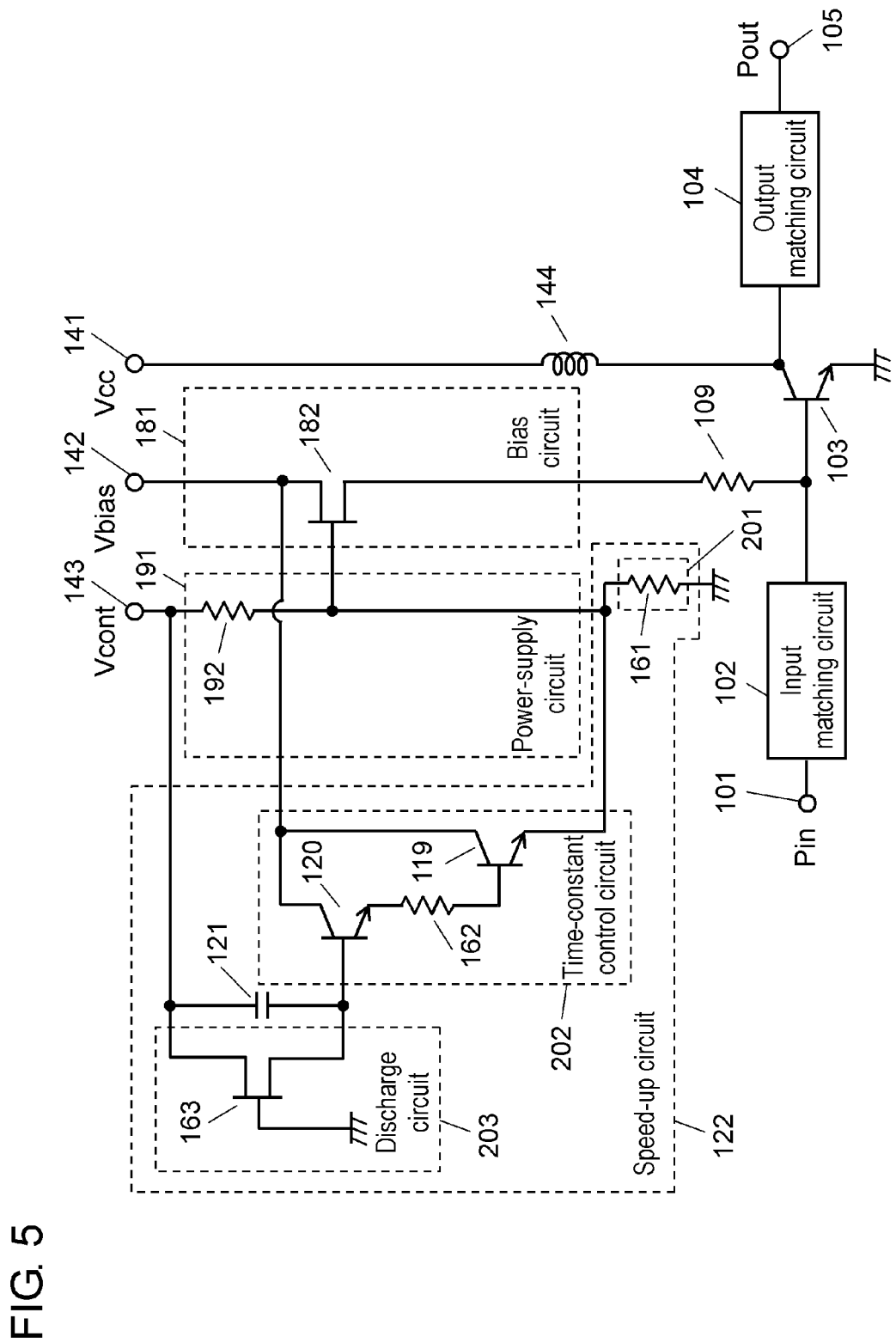
FIG. 5 is a circuit diagram of a high frequency power amplifier according to a third embodiment of the present invention.
Figure 6:
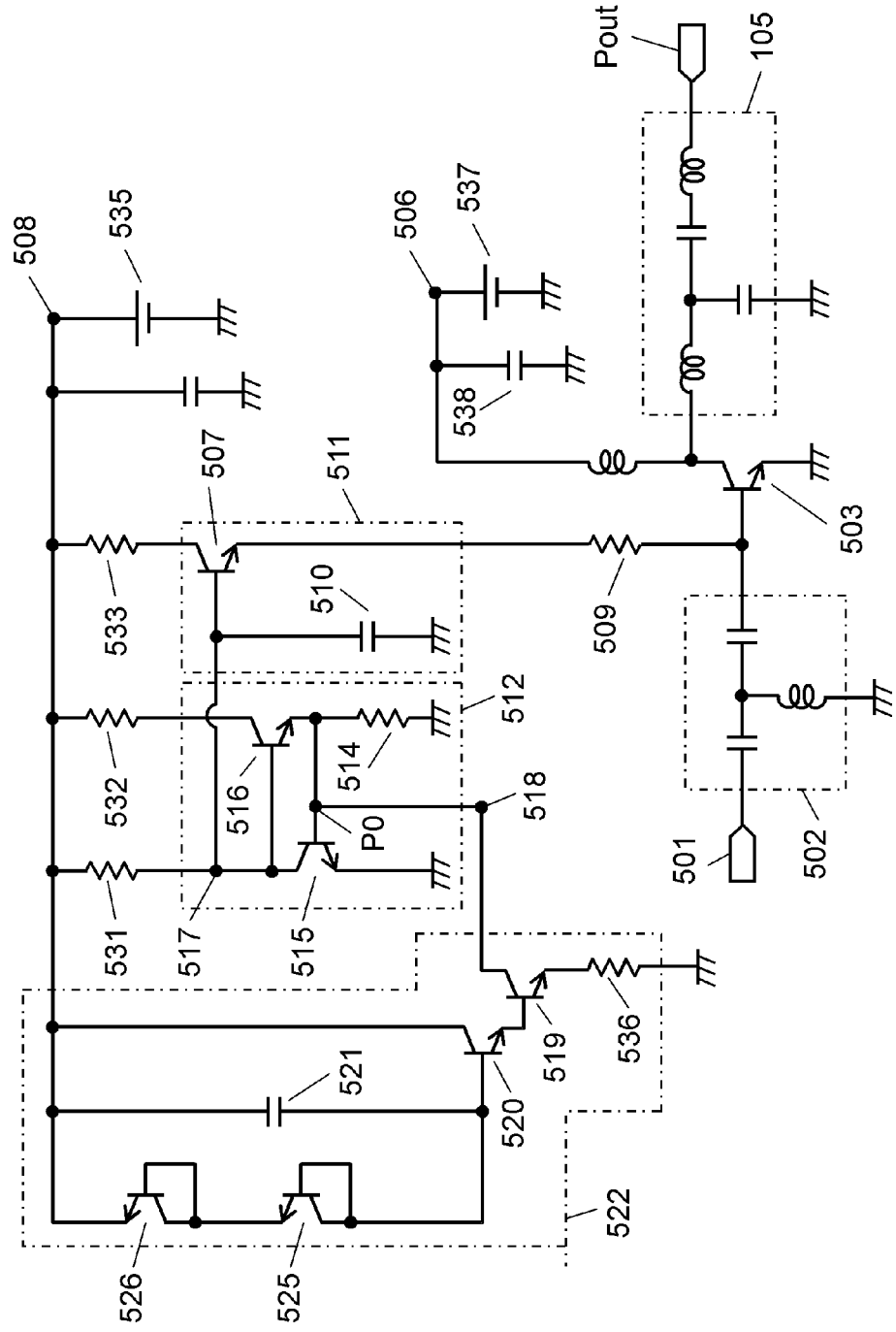
FIG. 6 is a circuit diagram of a power amplifier described in PTL 1.

FIG. 5 illustrates a circuit diagram of a high frequency power amplifier according to a third embodiment. The high frequency power amplifier of the third embodiment has the same configuration as the high frequency power amplifier of the first embodiment except the power-supply circuit and the bias circuit, the same component is designated by the same numeral, and a different point is mainly described while the overlapping description is omitted.

Bias circuit 181 includes bias FET 182 that is the first FET supplying the bias to amplification transistor 103. The source of bias FET 182 is connected to the base of amplification transistor 103, and the gate of bias FET 182 is grounded through resistor 161.

Time-constant control circuit 202 includes transistor 119 that is the third transistor, resistor 162 that is the second resistor, and transistor 120 that is the fourth transistor. The emitter of transistor 119 is grounded through resistor 161. One end of resistor 162 is connected to the base of transistor 119. The emitter of transistor 120 is connected to the base of transistor 119 through resistor 162, and the collector of transistor 120 is connected to the collector of transistor 119 and the drain of bias FET 182.

Power-supply circuit 191 includes resistor 192 that is the third resistor. One end of resistor 192 is connected to control voltage terminal 143, and the other end is connected to bias FET 182.

Thus, power-supply circuit 191 of the high frequency power amplifier in FIG. 5 includes resistor 192 in which one end is connected to control voltage terminal 143. Bias circuit 181 includes bias FET 182. The source of bias FET 182 is connected to the base of amplification transistor 103 through stabilizing resistor 109, and the drain is connected to bias power supply terminal 142. The gate of bias FET 182 is connected to control voltage terminal 143 through resistor 192, and grounded through resistor 161.

Also in the third embodiment in FIG. 5, during the rise of the control voltage, the current flows transiently into resistor 161 to raise the gate potential at bias FET 182. Therefore, the bias supplied to the amplification transistor 103 can transiently be increased. In the third embodiment, the same effect as the first embodiment is obtained.

Resistor 161 may have a fixed resistance value that is determined according to use conditions of the high frequency power amplifier, such as collector power supply voltage Vcc, bias voltage Vbias, the base current (the bias) of bias transistor 107, or resistor 161 may be a variable resistor.

Alternatively, resistor 161 may be a semi-fixed resistor that is determined by trimming and the like in a production process.

As described above, although the high frequency power amplifiers of the embodiments of the present invention are described with reference to the embodiments, the present invention is not limited to the embodiments. Modifications obtained by applying various modifications that occur to those skilled in the art to the embodiment of the invention without departing from the spirit of the present invention, also forms constructed by combining the components in different embodiments, are included within the scope of the present invention.

As described above, the compact high frequency power amplifier of the present invention suppresses the strain and degradation of modulation accuracy, which are caused by the temperature fluctuation immediately after the start-up of the amplifier, so that the high frequency power amplifier can be applied to mobile communication devices including the mobile phone.

What is claimed is:

1. A high frequency power amplifier comprising:
a first transistor that performs power amplification of a high frequency signal;
a bias circuit that supplies a bias to the first transistor according to a reference voltage;
a power-supply circuit that applies the reference voltage to the bias circuit, the reference voltage controlling an amount of bias supplied to the first transistor from the bias circuit;
a control voltage terminal to which a control signal is applied, the control signal controlling start-up and stopping of the bias circuit; and
a speed-up circuit that increases the amount of bias supplied to the first transistor from the bias circuit by transiently increasing the reference voltage output from the power-supply circuit during rise of the control voltage,
wherein the speed-up circuit includes:
a capacitor in which one end is connected to the control voltage terminal;
a time-constant control circuit that is connected to the other end of the capacitor;
a discharge circuit that is connected in parallel with the capacitor; and
an overshoot control circuit that is connected to the time-constant control circuit and the power-supply circuit,
the overshoot control circuit determines an increasing amount of the reference voltage output from the power-supply circuit when the reference voltage is transiently increased according to a charge amount charged in the capacitor, and
the time-constant control circuit determines a time constant in charging and discharging the capacitor through the time-constant control circuit and the overshoot control circuit.

2. The high frequency power amplifier according to claim 1, wherein
the bias circuit includes a second transistor that supplies a bias to the first transistor,
the overshoot control circuit includes a first resistor in which one end is grounded,
the time-constant control circuit includes;
a third transistor in which an emitter is grounded through the first resistor;
a second resistor in which one end is connected to a base of the third transistor; and
a fourth transistor in which an emitter is connected to the base of the third transistor through the second resistor while a collector is connected to a collector of the third transistor and a collector of the second transistor,
one end of the capacitor is connected to a base of the fourth transistor, and the other end is connected to the control voltage terminal,
the discharge circuit includes an FET, a gate of the FET is grounded, a source of the FET is connected to the base of the fourth transistor, and a drain of the FET is connected to the control voltage terminal,
the power-supply circuit includes a third resistor, one end of the third resistor is connected to the control voltage terminal, and the other end is connected to the base of the second transistor,
an emitter of the second transistor of the bias circuit is connected to a base of the first transistor, and a base of the second transistor is grounded through the first resistor.

3. The high frequency power amplifier according to claim 1, wherein
the bias circuit includes a first FET that supplies a bias to the first transistor,
the overshoot control circuit includes a first resistor in which one end is grounded,
the time-constant control circuit includes:
a third transistor in which an emitter is grounded through the first resistor;
a second resistor in which one end is connected to a base of the third transistor; and
a fourth transistor in which an emitter is connected to the base of the third transistor through the second resistor while a collector is connected to a collector of the third transistor and a drain of the first FET,
one end of the capacitor is connected to a base of the fourth transistor, and the other end is connected to the control voltage terminal,
the discharge circuit includes a second FET, a gate of the second FET is grounded, a source of the second FET is connected to the base of the fourth transistor, and a drain of the second FET is connected to the control voltage terminal,
the power-supply circuit includes a third resistor, one end of the third resistor is connected to the control voltage terminal, and the other end is connected to the first FET,
a source of the first FET of the bias circuit is connected to a base of the first transistor, and
a gate of the first FET is grounded through the first resistor.

4. The high frequency power amplifier according to claim 2, wherein
the power-supply circuit includes:
a fifth transistor in which a collector is connected to the base of the second transistor while an emitter is grounded through the first resistor;
a fourth resistor in which one end is connected to a base of the fifth transistor while the other end is grounded; and
a sixth transistor, in which a collector is connected to a collector of the second transistor, a base is connected to the base of the second transistor, and an emitter is grounded through the fourth resistor.

5. The high frequency power amplifier according to claim 2, wherein
the power-supply circuit further includes:
a fifth transistor in which a collector is connected to the base of the second transistor while a base is connected to the collector; and
a sixth transistor, in which a collector is connected to an emitter of the fifth transistor, a base is connected to the collector, and an emitter is connected to the other end of the first resistor, and
the third resistor, the fifth transistor, and the sixth transistor constitute a temperature compensation circuit that performs temperature compensation of the reference voltage.

* * * * *